(12) United States Patent
Lee et al.

(10) Patent No.: US 10,839,901 B1
(45) Date of Patent: Nov. 17, 2020

(54) ELECTRONIC DEVICE AND OPERATING METHOD OF ELECTRONIC DEVICE

(71) Applicant: SK hynix Inc., Icheon (KR)

(72) Inventors: Hyung Dong Lee, Suwon (KR); Tae Hoon Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/661,551

(22) Filed: Oct. 23, 2019

(30) Foreign Application Priority Data

May 3, 2019 (KR) .......................... 10-2019-0052490

(51) Int. Cl.
*G11C 13/00* (2006.01)
*G11C 11/16* (2006.01)

(52) U.S. Cl.
CPC ........ *G11C 13/004* (2013.01); *G11C 11/1655* (2013.01); *G11C 11/1657* (2013.01); *G11C 11/1673* (2013.01); *G11C 13/0026* (2013.01); *G11C 13/0028* (2013.01); *G11C 2013/005* (2013.01); *G11C 2013/0054* (2013.01); *G11C 2213/15* (2013.01); *G11C 2213/72* (2013.01)

(58) Field of Classification Search
CPC .............. G11C 13/004; G11C 11/1657; G11C 13/0028; G11C 13/0026; G11C 11/1655; G11C 11/1673; G11C 2213/72; G11C 2013/0054; G11C 2013/005; G11C 2213/15
See application file for complete search history.

(56) References Cited

U.S. PATENT DOCUMENTS

| 7,586,787 | B2 | 9/2009 | Vo et al. | |
| 9,627,055 | B1 | 4/2017 | Robustelli | |
| 2008/0062741 | A1* | 3/2008 | Choi | G11C 13/0004 365/148 |
| 2016/0267974 | A1* | 9/2016 | Miyazaki | G11C 13/0023 |

* cited by examiner

*Primary Examiner* — Ajay Ojha

(57) ABSTRACT

A semiconductor memory includes bit lines, word lines, memory cells coupled between the bit lines and the word lines, and a sensing circuit configured to sense a state of a selected memory cell. During a read operation of the selected memory cell, the electronic device is configured to precharge a selected word line to a first voltage, to precharge an unselected word line to a second voltage, to float the selected word line and the unselected word line, to apply a bit line voltage a selected bit line, to adjust a voltage level of the unselected word line using a first leakage current that flows between an unselected bit line and the unselected word line, to couple the selected word line and the unselected word line to the sensing circuit, and to compare a voltage level of the selected word line with the voltage level of the unselected word line.

20 Claims, 12 Drawing Sheets

ELECTRONIC DEVICE AND OPERATING METHOD OF ELECTRONIC DEVICE

CROSS-REFERENCE TO RELATED APPLICATION

The present application claims priority under 35 U.S.C. § 119(a) to Korean patent application number 10-2019-0052490, filed on May 3, 2019, which is incorporated herein by reference in its entirety.

BACKGROUND

Field of Invention

Various embodiments of the present disclosure generally relate to a memory circuit or device, and application thereof in an electronic device.

Description of Related Art

Recently, miniaturization, low power consumption, high performance, and diversification of electronic devices require semiconductor devices configured to store information in various electronic devices such as computers and portable communication apparatuses, and research thereon is being conducted. Examples of semiconductor devices configured to store data using switching characteristics between different resistance phases depending on a voltage or current being applied may include a resistive random access memory (RRAM), a phase-change random access memory (PRAM), a ferroelectric random access memory (FRAM), a magnetic random access memory (MRAM), and an E-fuse.

SUMMARY

Various embodiments of the present disclosure provide an electronic device stably reading data of a resistive memory.

According to an embodiment, a method of operating an electronic device including a plurality of bit lines and a plurality of word lines may include precharging a selected word line from the plurality of word lines to a first voltage; precharging an unselected word line from the plurality of word lines to a second voltage; floating the selected word line and the unselected word line; applying a bit line voltage to a selected bit line from the plurality of bit lines; adjusting a voltage level of the unselected word line using a first leakage current that flows between an unselected bit line and the unselected word line; coupling the selected word line and the unselected word line to a sensing circuit; and comparing a voltage level of the selected word line with the voltage level of the unselected word line.

According to an embodiment, an electronic device may include a semiconductor memory including a plurality of bit lines, a plurality of word lines crossing the plurality of bit lines, and a plurality of memory cells coupled between the plurality of bit lines and the plurality of word lines, respectively; and a sensing circuit configured to sense a state of a selected memory cell from the plurality of memory cells, wherein during a read operation of the selected memory cell, the electronic device is configured to precharge a selected word line from the plurality of word lines to a first voltage, to precharge an unselected word line from the plurality of word lines to a second voltage, to float the selected word line and the unselected word line, to apply a bit line voltage a selected bit line from the plurality of bit lines, to adjust a voltage level of the unselected word line using a first leakage current that flows between an unselected bit line and the unselected word line, to couple the selected word line and the unselected word line to the sensing circuit, and to compare a voltage level of the selected word line with the voltage level of the unselected word line.

DETAILED DESCRIPTION

Hereinafter, various embodiments will be described in detail with reference to the accompanying drawings. In the following description, a detailed explanation of related functions and constitutions may be omitted for simplicity and conciseness. In addition, they may be embodied in different forms and should not be construed as limited to the embodiments set forth herein. Rather, these embodiments are provided so that this disclosure will be thorough and complete, and will fully convey the scope of the example embodiments to those skilled in the art.

It is also noted that in this specification, "connected/coupled" refers to one component not only directly coupling another component but also indirectly coupling another component through an intermediate component. In the specification, when an element is referred to as "comprising" or "including" a component, it does not exclude other components but may further include other components unless a description to the contrary is specifically pointed out in context.

Figure 1:
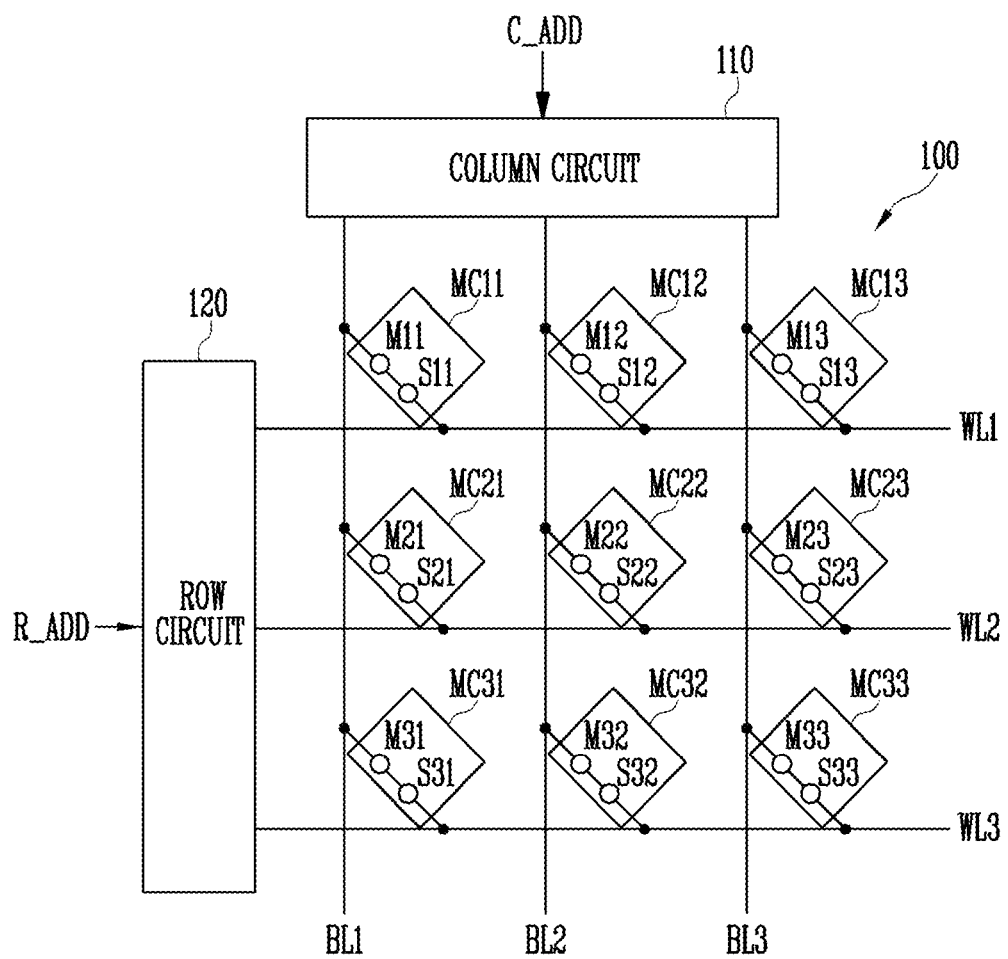
FIG. 1 is a diagram illustrating the structure of an electronic device according to an embodiment of the present disclosure.

FIG. 1 is a diagram illustrating the structure of an electronic device in accordance with an embodiment of the present disclosure. More specifically, FIG. 1 illustrates a memory cell array 100 of the electronic device.

Referring to FIG. 1, an electronic device according to an embodiment of the present disclosure may include a semiconductor memory, and the semiconductor memory may include row lines and column lines crossing the row lines. For example, the row lines may be word lines and the column lines may be bit lines. Alternatively, the row lines may be bit lines, and the column lines may be word lines. Hereinafter, the row lines are first to third word lines WL1 to WL3 and the column lines are first to third bit lines BL1 to BL3.

The semiconductor memory may include memory cells MC11 to MC33 respectively disposed between the bit lines BL1 to BL3 and the word lines WL1 to WL3. For example, the memory cells MC11 to MC33 may be located at respective intersections between the bit lines BL1 to BL3 and the word lines WL1 to WL3. The memory cells MC11 to MC33 may include select devices S11 to S33 and memory devices M11 to M33, respectively, each of the select devices S11 to S33 being coupled to a corresponding one of the memory devices M11 to M33 in series. Each of the select devices S11 to S33 may be electrically coupled to a corresponding one of the word lines WL1 to WL3. Each of the memory devices M11 to M33 may be electrically coupled to a corresponding one of the bit lines BL1 to BL3.

Each of the memory devices M11 to M33 may be configured to store data and include a variable resistance material. Each of the memory devices M11 to M33 may be a resistance change layer, a phase change layer, a magnetic tunnel junction layer, or the like. Each of the memory devices M11 to M33 may have a first resistance state (e.g., a low resistance state) or a second resistance state (e.g., a high resistance state) depending on data stored therein. For example, each of the memory devices M11 to M33 may have a low resistance value when it is in a crystalline state and may have a high resistance value when it is in an amorphous state. Hereinafter, the low resistance state is referred to as a SET state and the high resistance state is a RESET state.

Each of the select devices S11 to S33 may be configured to select a corresponding one of the memory cells MC11 to MC33 and may include a switching material. Each of the select devices S11 to S33 may be a metal insulator transition (MIT) device, a mixed ionic-electronic conducting (MIEC) device, an ovonic threshold switching (OTS) device, or the like. When the select devices S11 to S33 include OTS devices, a small amount of current may flow through the select devices S11 to S33 when they are turned off. When the amount of current being applied exceeds a threshold value, the select devices S11 to S33 may be turned on. When the select devices S11 to S33 are turned on, the amount of current flowing through the memory cells MC11 to MC33 may be drastically increased, and a voltage level at both ends may be drastically decreased. That is, a snapback phenomenon may occur.

However, the shape and the configuration of each of the memory cells MC11 to MC33 may vary. For example, the select devices S11 to S33 may be omitted in the memory cells MC11 to MC33, or the positions of the select devices S11 to S33 and the memory devices M11 to M33 may be switched in the memory cells MC11 to MC33.

In addition, the semiconductor memory may further include a column circuit 110 configured to control the bit lines BL1 to BL3, and a row circuit 120 configured to control the word lines WL1 to WL3. The row circuit 120 may be a row decoder, a word line decoder, a word line driver, or the like. The row circuit 120 may select one (e.g., the word line WL2) of the word lines WL1 to WL3, according to a row address R_ADD. The column circuit 110 may be a column decoder, a bit line decoder, a bit line driver, or the like. The column circuit 110 may select one (e.g., the bit line BL2) of the bit lines BL1 to BL3, according to a column address C_ADD. Accordingly, one (e.g., the memory cell MC22) of the memory cells MC11 to MC33 that is coupled between the selected bit line BL2 and the selected word line WL2 may be selected.

For convenience of explanation, FIG. 1 illustrates the memory cell array 100 including the three bit lines BL1 to BL3 and the three word lines WL1 to WL3. However, embodiments of the present disclosure are not limited thereto, and the number of bit lines BL1 to BL3, or the number of word lines WL1 to WL3, or both included in the memory cell array 100 may vary.

Figure 2:
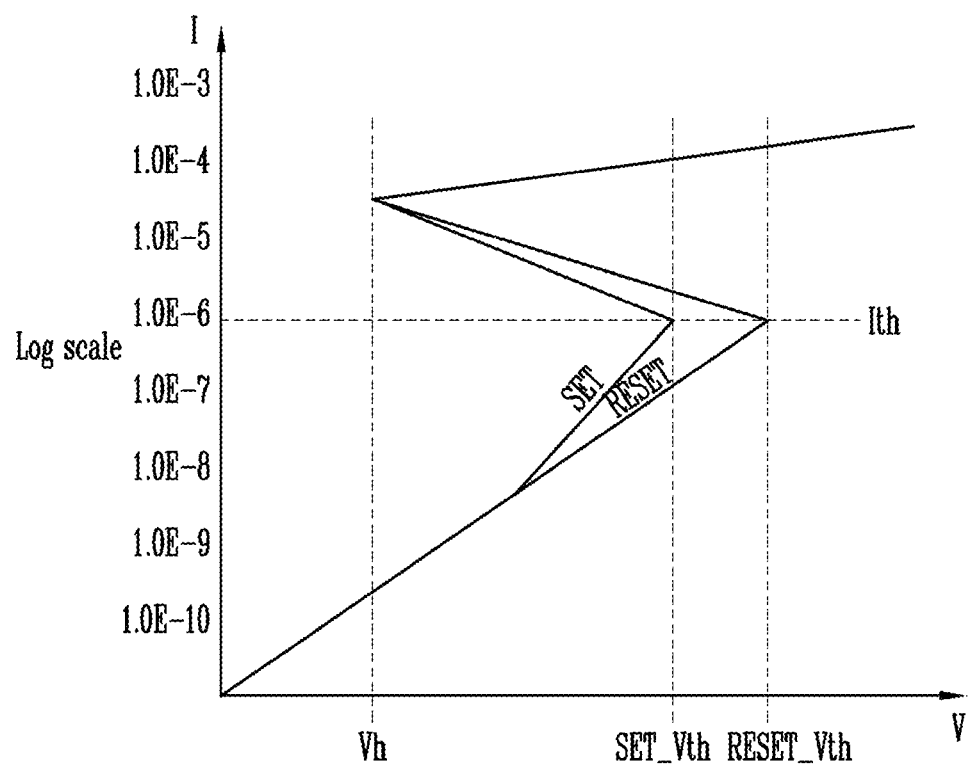
FIG. 2 is a graph illustrating an I-V curve of a memory cell according to an embodiment of the present disclosure.

FIG. 2 is a graph illustrating an I-V curve of a memory cell according to an embodiment of the present disclosure. The X axis represents a voltage (V) applied to both ends of a memory cell (e.g., one of the memory cells MC11 to MC33 in FIG. 1) and the Y axis represents a current (I) flowing through the memory cell.

Referring to FIG. 2, as a level of the voltage applied to both ends of the memory cell increases, the amount of current flowing through the memory cell may increase. A first amount of current flowing through a first memory cell in a SET state may be greater than a second amount of current flowing through a second memory cell in a RESET state when the same voltage level is applied to the first and second memory cells.

When the voltage level across both ends of the first memory cell in the SET state reaches a threshold voltage SET_Vth, the amount of current flowing through the first memory cell may reach a threshold current Ith, and a select device of the first memory cell may be turned on. As a result, a snapback phenomenon may occur in which the voltage level across both ends of the first memory cell decreases drastically and the amount of current flowing through the first memory cell increases drastically. When the voltage across both ends of the first memory cell reaches a hold voltage Vh, the first memory cell may be turned off.

When the voltage across both ends of the second memory cell in the RESET state reaches a threshold voltage RESET_Vth, the amount of current flowing through the second memory cell may reach the threshold voltage Ith, and a select device of the second memory cell may be turned on. As a result, a snapback phenomenon may occur in which the voltage level across both ends of the second memory cell decreases drastically and the amount of current flowing through the second memory cell increases drastically. When the voltage across both ends of the second memory cell reaches the hold voltage Vh, the second memory cell may be turned off.

Figure 3A:
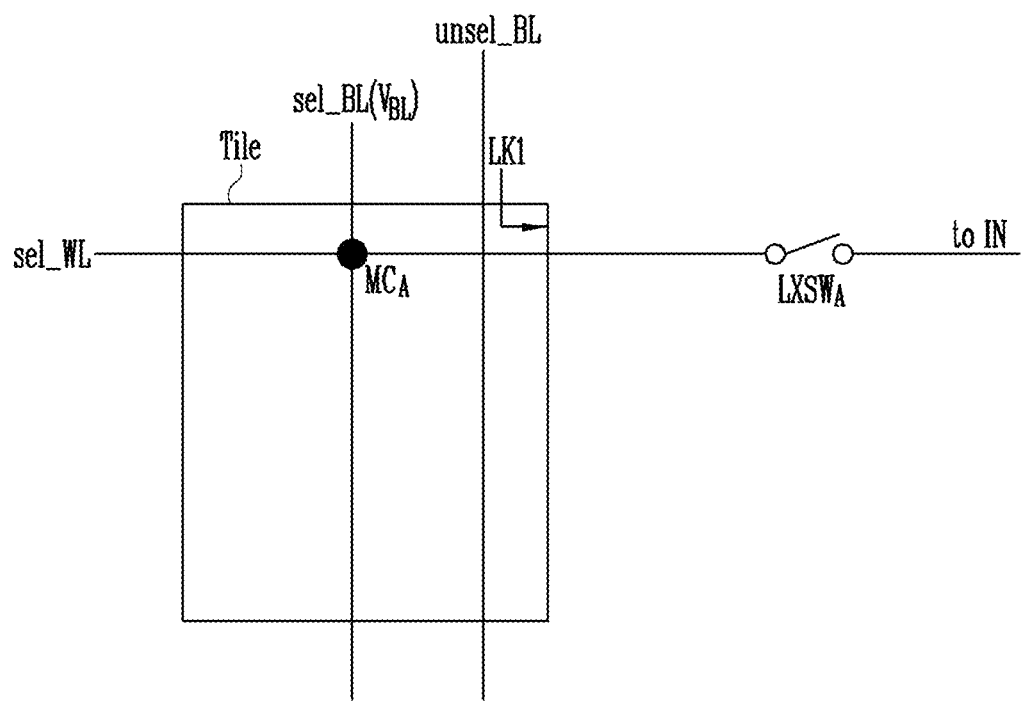
FIGS. 3A and 3B are diagrams illustrating a method of operating an electronic device according to an embodiment of the present disclosure.
Figure 3B:
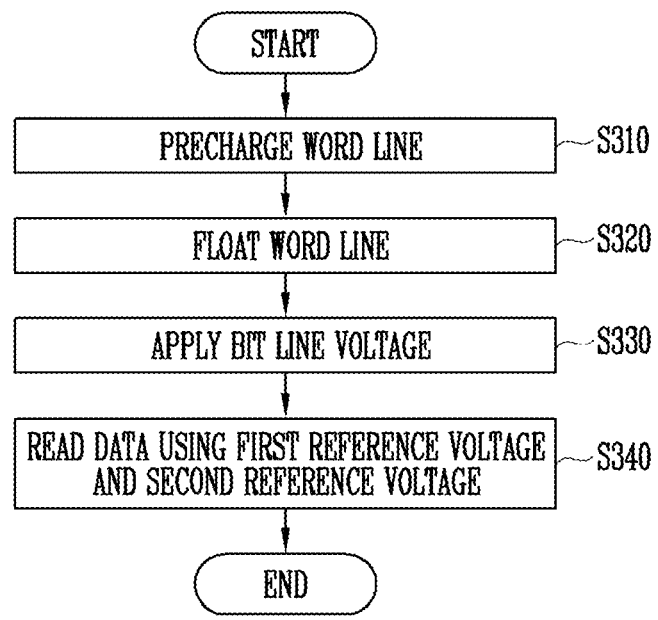

FIGS. 3A and 3B are diagrams illustrating a method of operating an electronic device according to an embodiment of the present disclosure.

With referring to FIGS. 3A and 3B, at S310, word lines may be precharged. For example, a selected word line sel_WL, among the word lines, may be precharged to a voltage $V_{BBRD}$. The voltage $V_{BBRD}$ may have a negative level.

At S320, the precharged selected word line sel_WL may be floated. At S330, a bit line voltage $V_{BL}$ may be applied to a selected bit line sel_BL among bit lines. Thus, a voltage level of the selected bit line sel_BL may be increased and a read voltage may be applied to both ends of a selected memory cell $MC_A$. In addition, as the voltage level of the selected bit line sel_BL is increased, the read voltage may be increased accordingly.

When the selected memory cell $MC_A$ has the RESET state and the read voltage is smaller than a threshold voltage (e.g., the threshold voltage RESET_Vth in FIG. 2) of the memory cell $MC_A$, the memory cell $MC_A$ may not be turned on. Therefore, the selected word line sel_WL may maintain the precharged voltage level.

When the selected memory cell $MC_A$ has the SET state and the read voltage is greater than the threshold voltage SET of the memory cell $MC_A$ in the SET state, the memory cell $MC_A$ may be turned on and a snapback phenomenon may occur. Due to the snapback phenomenon, current may flow through the memory cell $MC_A$ and a voltage level of the selected word line sel_WL may be increased. Therefore, when the read voltage applied to the selected memory cell $MC_A$ is reduced to reach the hold voltage Vh, the selected memory cell $MC_A$ may be turned off.

Subsequently, at S340, data stored in the selected memory cell $MC_A$ may be read. The stored data may be read using a sensing circuit (e.g., a sense amplifier). For example, a first input terminal IN and a second input terminal INB of the sensing circuit may be precharged to a first reference voltage (e.g., the first reference voltage $V_{REF}1$ in FIG. 5B). The first input terminal IN may be coupled to the selected word line sel_WL. For example, by turning on a switch $LXSW_A$, the first input terminal IN may be coupled to the selected word line sel_WL. As a result, charges may be shared between the first input terminal IN and the selected word line sel_WL. Voltage levels of the first input terminal IN and the second input terminal INB may be compared with each other to determine data stored in the selected memory cell $MC_A$.

The voltage level of the selected word line sel_WL may be changed by a first leakage current LK1 between an unselected bit line unsel_BL and the selected word line sel_WL. When the selected memory cell $MC_A$ has the RESET state, the voltage level of the selected word line sel_WL may be increased due to the first leakage current LK1, so that a difference between the increased voltage level of the selected word line sel_WL and the first reference voltage $V_{REF}1$ may be reduced. In other words, a sensing margin may be reduced. For example, a sensing margin (e.g., a sensing margin M_RS1 in FIG. 6A) for the RESET state of the selected memory cell $MC_A$ may be reduced due to the increased voltage level (e.g., a voltage level RESET(LK1) of the first input terminal IN in FIG. 6A) of the first input terminal IN. Therefore, according to an embodiment of the present disclosure, a voltage level of the second input terminal INB may be increased to a second reference voltage (e.g., a second reference voltage $V_{REF}2$ in FIG. 5B) that is greater than the first reference voltage, thereby increasing the sensing margin.

According to the above-described method, two reference voltages may be used when data is read. When charges are shared between the selected word line sel_WL and the first input terminal IN, the first input terminal IN may have a level of the first reference voltage $V_{REF}1$. When the voltage levels of the first input terminal IN and the second input terminal INB are compared with each other, the second input terminal INB may have a level of the second reference voltage $V_{REF}2$. Therefore, by increasing the voltage level of the second input terminal INB to the second reference voltage $V_{REF}2$, a sensing margin may be ensured even when the voltage level of the selected word line sel_WL is increased due to the leakage current LK1.

Figure 4A:
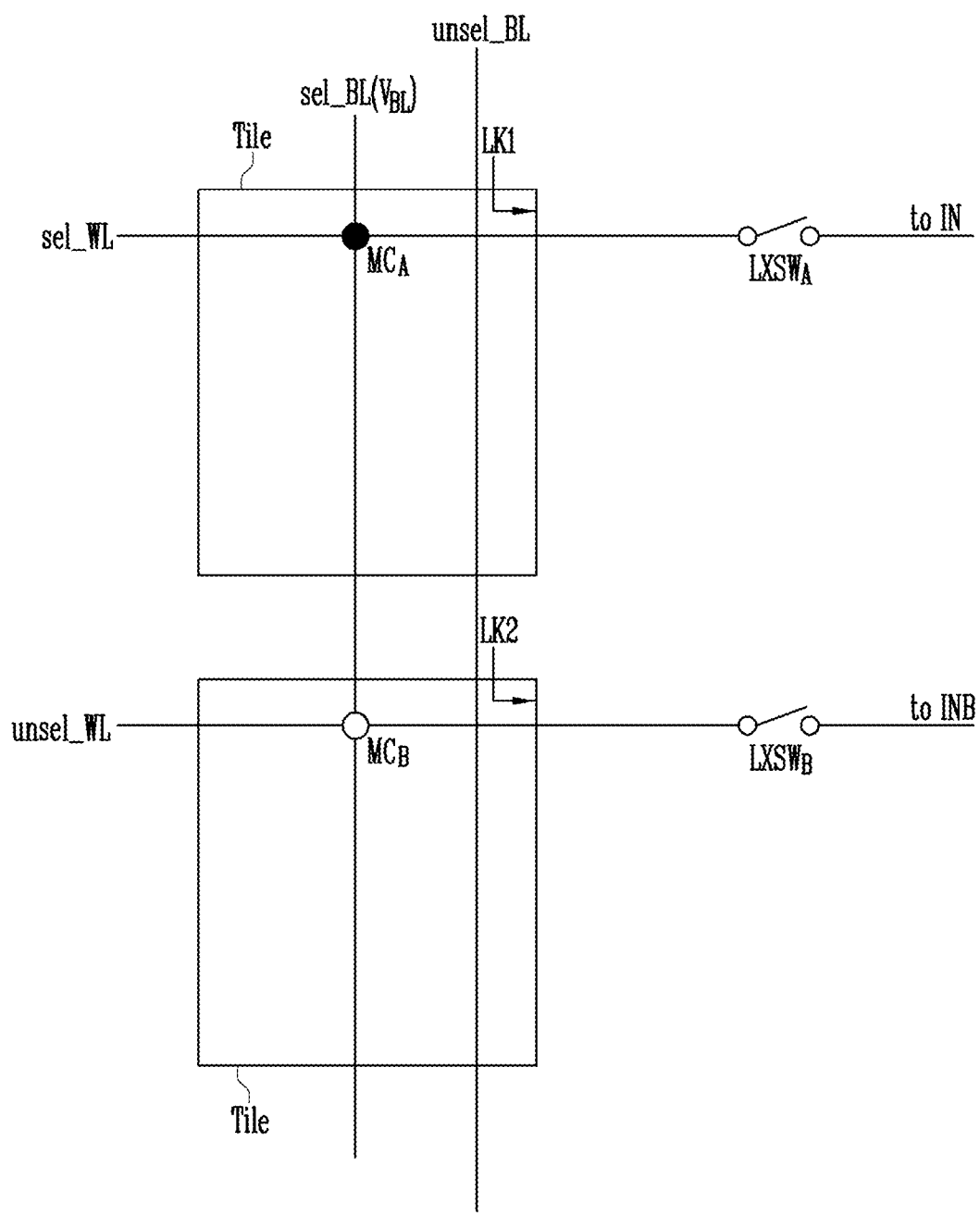
FIGS. 4A and 4B are diagrams illustrating a method of operating an electronic device according to an embodiment of the present disclosure.
Figure 4B:
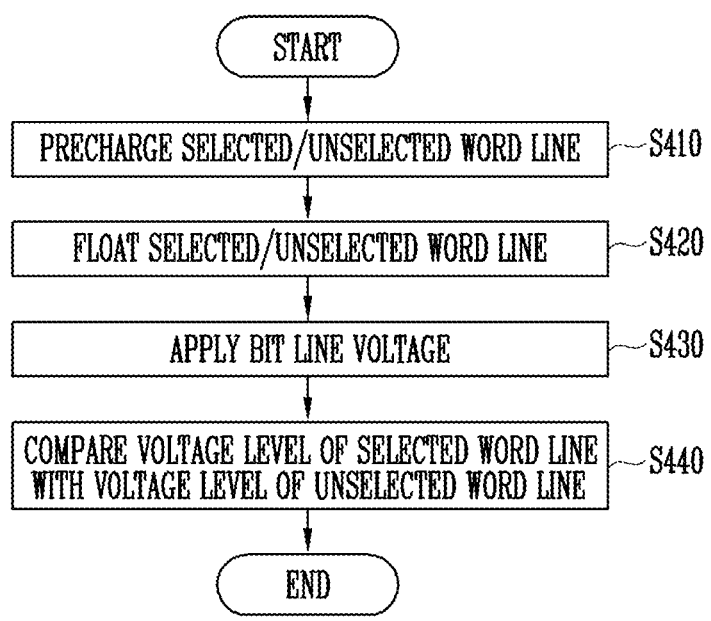

FIGS. 4A and 4B are diagrams illustrating a method of operating an electronic device according to an embodiment of the present disclosure. Hereinafter, any repetitive detailed description of components already mentioned above will be omitted.

With referring to FIGS. 4A and 4B, at S410, word lines may be precharged. For example, the selected word line sel_WL may be precharged to a first voltage (e.g., a voltage $V_{BBRD}$ in FIG. 5B) and an unselected word line unsel_WL may be precharged to a second voltage (e.g., a voltage $V_B$ in FIG. 5). For example, each of the first voltage and the second voltage may have a negative level. The second voltage may have a greater voltage level than the first voltage.

At S420, the precharged selected word line sel_WL and the precharged unselected word line unsel_WL may be floated. At S430, a bit line voltage $V_{BL}$ may be applied to the selected bit line sel_BL among a plurality of bit lines. Thus, a voltage level of the selected bit line sel_BL may be increased and a read voltage may be applied to both ends of each of the selected memory cell $MC_A$.

When the selected memory cell $MC_A$ is in the SET state, the selected memory cell $MC_A$ may be turned on as the voltage level of the selected bit line sel_BL is increased. Accordingly, the voltage level of the selected word line sel_WL may be increased. When the selected memory cell $MC_A$ is in the RESET state, the selected memory cell $MC_A$ may remain turned off and the voltage level of the selected word line sel_WL may be maintained at the first voltage.

The unselected memory cell $MC_B$ may remain turned off and a voltage level of the unselected word line unsel_WL may be maintained at the second voltage. The selected memory cell $MC_A$ and the unselected memory cell $MC_B$ may belong to the same or different tiles. A tile may refer to a unit for which a write operation or a read operation is performed.

A first leakage current LK1 may be generated between the unselected bit line unsel_BL and the selected word line sel_WL. In addition, the voltage level of the selected word line sel_WL may be changed by the first leakage current LK1. For example, when the selected memory cell $MC_A$ is in the RESET state, the voltage level of the selected word line sel_WL may be increased and become greater than the first voltage.

A second leakage current LK2 may be generated between the unselected bit line unsel_BL and the unselected word line unsel_WL. In addition, the voltage level of the unselected word line unsel_WL may be adjusted by the second leakage current LK2. For example, the voltage level of the unselected word line unsel_WL may be increased and become greater than the second voltage.

At S440, the voltage level of the selected word line sel_WL and the voltage level of the unselected word line unsel_WL may be compared with each other, thereby reading data stored in the selected memory cell $MC_A$. For example, the first input terminal IN and the second input terminal INB of the sensing circuit may be precharged to a first reference voltage (e.g., the first reference voltage $V_{REF}1$ in FIG. 5B). The first reference voltage may be the same as the second voltage or may have a lower voltage level than the second voltage. The first input terminal IN may be coupled to the selected word line sel_WL. For example, by turning on a first switch $LXSW_A$, the first input terminal IN may be coupled to the selected word line sel_WL. Thus, charges may be shared between the first input terminal IN and the selected word line sel_WL. The second input terminal INB may be coupled to the unselected word line unsel_WL. For example, by turning on a second switch $LXSW_B$, the second input terminal INB may be coupled to the unselected word line unsel_WL. Thus, charges may be shared between the second input terminal INB and the unselected word line unsel_WL. Since the unselected word line unsel_WL has a greater voltage level than the first reference voltage $V_{REF}1$, the voltage level of the second input terminal INB may be increased by charge sharing. As a result, the increased level of the second input terminal INB may become a second reference voltage (e.g., the second reference voltage $V_{REF}2$ in FIG. 5B). The voltage levels of the first input terminal IN and the second input terminal INB may be compared with each other. In other words, the voltage level of the first input terminal IN may be compared with the second reference voltage of the second input terminal INB.

According to the above-described method, the selected word line sel_WL and the unselected word line unsel_WL may be precharged to different levels. For example, the unselected word line unsel_WL is precharged to the second voltage having a level greater than that of the selected word line sel_WL. In addition, the voltage level of the unselected word line unsel_WL is increased due to the second leakage current LK2. Thus, when the unselected word line unsel_WL is coupled to the second input terminal INB using the second switch $LXSW_B$, the voltage level of the second input terminal INB may reach the 15 second reference voltage that is greater than the first reference voltage. Precharging the unselected word line unsel_WL to the second voltage, increasing the voltage level of the unselected word line unsel_WL using the second leakage current LK2, and coupling the unselected word line unsel_WL to the second input terminal INB using the second switch $LXSW_1$ for charge sharing between the unselected word line unsel_WL and the second input terminal INB may lead to the increased voltage level of the second input terminal INB. As a result, a sensing margin may be increased.

Figure 5A:
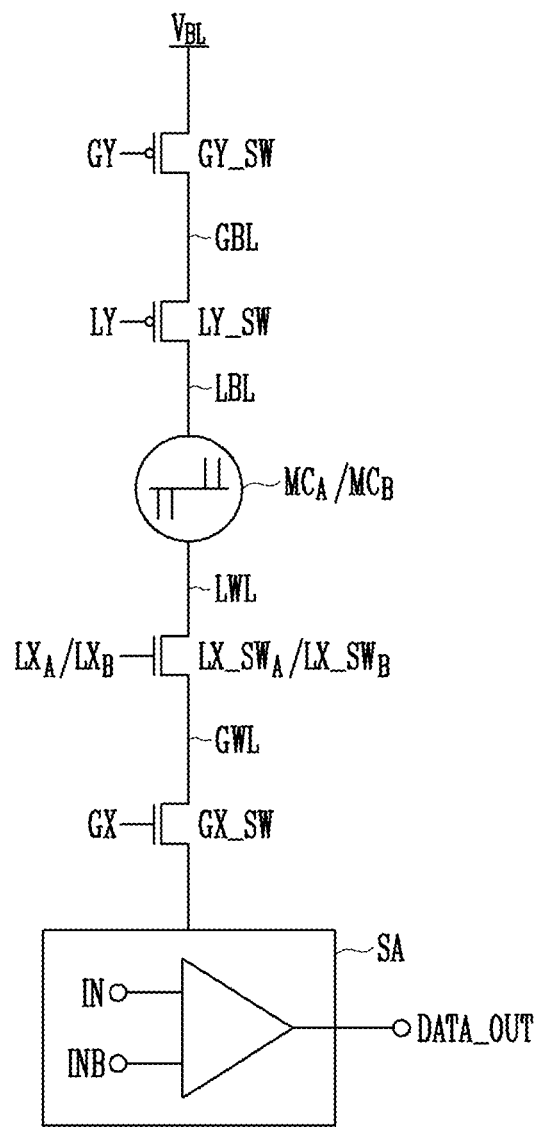
FIGS. 5A and 5B are diagrams illustrating a method of operating an electronic device according to an embodiment of the present disclosure.
Figure 5B:
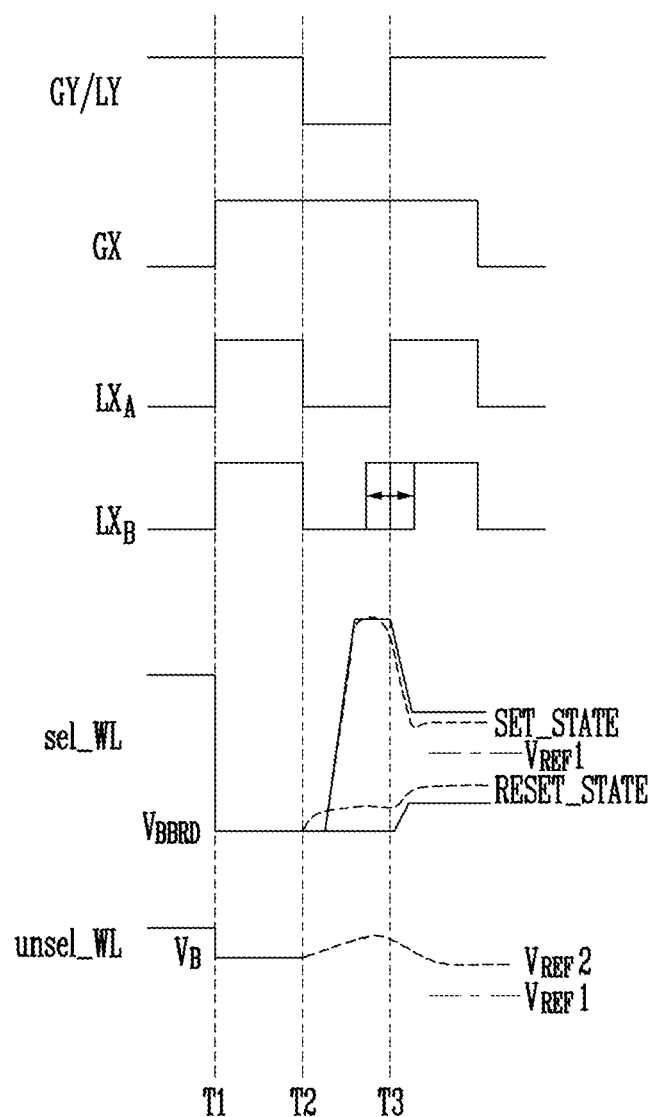

FIGS. 5A and 5B are diagrams illustrating a method of operating an electronic device according to an embodiment of the present disclosure. Hereinafter, repetitive detailed description of components already mentioned above will be omitted for the interest of brevity.

Referring to FIG. 5A, an electronic device according to an embodiment of the present disclosure may include a global bit line GBL, a local bit line LBL, a memory cell (e.g., a selected memory cell $MC_A$ or an unselected memory cell $MC_B$), a local word line LWL, and a global word line GWL. The memory cell may be coupled between the local bit line LBL and the local word line LWL.

A single global bit line GBL may be coupled to a plurality of local bit lines LBL. A plurality of local bit line switches LY_SW may be coupled between the single global bit line GBL and the plurality of local bit lines LBL, respectively. Therefore, the connections between the local bit lines LBL and the global bit lines GBL may be controlled by the plurality of local bit line switches LY_SW, respectively. A global bit line switch GY_SW may be coupled to the global bit line GBL. Applying a bit line voltage $V_{BL}$ to the global bit line GBL may be controlled by the global bit line switch GY_SW.

A single global word line GWL may be coupled between a plurality of local word lines LWL. A plurality of local word line switches (e.g., a first local word line switch $LX\_SW_A$ and a second local word line switch $LX\_SW_B$) may be coupled between the single global word line GWL and the plurality of local word lines LWL, respectively. Therefore, the connections between the local word lines LWL and the global word line GWL may be controlled by the plurality of local word line switches, respectively. A global word line switch GX_SW may be coupled between the global word line GWL and a sense amplifier SA.

Referring to FIGS. 5A and 5B, at a first time T1, the selected word line sel_WL, among the plurality of local word lines LWL, may be precharged to a first voltage $V_{BBRD}$, and the unselected word line unsel_WL may be precharged to a second voltage $V_B$. First and second local word line signals $LX_A$ and $LX_B$ may be activated to a high level to turn on the first and second local word line switches $LX\_SW_A$ and $LX\_SW_B$, respectively, when a global word line signal GX may be activated to a high level to turn on the global word line switch GX_SW. As a result, the selected word line sel_WL may be precharged to the first voltage $V_{BBRD}$ and the unselected word line unsel_WL may be precharged to the second voltage $V_B$. Each of the first voltage $V_{BBRD}$ and the second voltage $V_B$ may have a negative level, and the second voltage $V_B$ may have a greater voltage level than the first voltage $V_{BBRD}$. For example, the second negative voltage $V_B$ has an absolute magnitude smaller than that of the first negative voltage $V_{BBRD}$, and thus the second voltage $V_B$ has a level greater than that of the first voltage $V_{BBRD}$.

At the first time T1, a global bit line signal GY and a local bit line signal LY may have a first value (e.g., a high level) indicating a deactivated state, and the global bit line switch GY_SW and the local bit line switch LY_SW may be turned off.

At a second time T2, the selected word line sel_WL and the unselected word line unsel_WL may be floated. The first and second local word line switches $LX\_SW_A$ and $LX\_SW_B$ may be turned off by deactivating the local word line signals $LX_A$ and $LX_B$, so that the local word line LWL may be floated.

At the second time T2, a bit line voltage (e.g., the bit line voltage $V_{BL}$ In FIG. 4A) may be applied to a selected bit line (e.g., the selected bit line sel_BL in FIG. 4A) among the plurality of local bit lines LBL. The global bit line switch GY_SW and the local bit line switch LY_SW may be turned on by activating the global bit line signal GY and the local bit line signal LY to a second value (e.g., a low level). In this manner, the bit line voltage $V_{BL}$ may be applied to the selected bit line, and the voltage levels of the global bit line GBL and the local bit line LBL may be increased.

When the selected memory cell $MC_A$ is in the SET state, the memory cell $MC_A$ may be turned on as the voltage level of the selected bit line sel_BL is increased. Accordingly, the voltage level of the selected word line sel_WL may be increased. A first leakage current (e.g., the first leakage current LK1 in FIG. 4A) may be formed between the unselected bit line unsel_BL and the selected word line sel_WL, so that the voltage level of the selected word line sel_WL may be changed. For example, the voltage level of the selected word line sel_WL may be reduced as indicated by a first dotted line SET_STATE compared to a first solid line indicating the voltage level of the selected word line sel_WL in the absence of the first leakage current.

When the selected memory cell $MC_A$ is in the RESET state, the selected memory cell $MC_A$ may remain turned off and the voltage level of the selected word line sel_WL may be maintained at the first voltage $V_{BBRD}$ in the absence of the first leakage current. The first leakage current may be formed between the unselected bit line unset_BL and the selected word line seL_WL, so that the voltage level of the selected word line seL_WL may be changed. For example, the voltage level of the selected word line sel_WL may be increased as indicated by a second dotted line RESET_STATE compared to a second solid line indicating the voltage level of the selected word line sel_WL in the absence of the first leakage current.

The unselected memory cell $MC_B$ may remain turned off and the voltage level of the unselected word line unsel_WL may be maintained at the voltage $V_B$ in the absence of a second leakage current (e.g., the second leakage current LK2 in FIG. 4A). The second leakage current may be generated between the unselected bit line unsel_BL and the unselected word line unsel_WL, so that the voltage level of the unselected word line unsel_WL may be adjusted. For example, the voltage level of the unselected word line unsel_WL may be increased as indicated by a third dotted line.

At a third time T3, the driving of the bit line BL may be stopped. The global bit line switch GY_SW and the local bit line switch LY_SW may be turned off by deactivating the global bit line signal GY and the local bit line signal LY to a high level.

At the third time T3, data stored in the selected memory cell $MC_A$ may be read. The first and second local word line switches $LX\_SW_A$ and $LX\_SW_B$ may be turned on by respectively activating (or asserting) the first and second local word line signals $LX_A$ and $LX_B$ to a high level. Therefore, the selected word line seL_WL and the unselected word line unsel_WL may be coupled to the first input terminal IN and the second input terminal INB of the sense amplifier SA, respectively. In an embodiment, both of the first and second local word line signals $LX_A$ and $LX_B$ may be activated substantially at the same time (e.g., the third time T3). In other embodiments, the first and second local word line signals $LX_A$ and $LX_B$ may be activated at different times. For example, the second local word line signal $LX_B$ may be activated a first given time interval before the first local word line signal $LX_A$ is activated at the third time T3, or the second local word line signal $LX_B$ may be activated a second given time interval after the first local word line signal $LX_A$ has been activated at the third time T3. When the second local word line signal $LX_B$ is activated the first given time interval before activating the first local word line signal $LX_A$, the first given time interval is sufficiently long to settle the voltage of the unselected word line unsel_WL to a steady-state value (e.g., a second reference voltage $V_{REF}2$) before the sense amplifier SA compares the voltage the selected word line sel_WL with the voltage of the unselected word line unsel_WL, thereby more reliably determining data stored in the selected memory cell $MC_A$. Each of the first input terminal IN and the second input terminal INB may be precharged to the first reference voltage $V_{REF}1$. The voltage level of the first reference voltage $V_{REF}1$ may be the same as or less than the second voltage $V_B$. When the first input terminal IN may be coupled to the selected word line sel_WL using the first local word line switch $LX\_SW_A$, charges may be shared between the first input terminal IN and the selected word line sel_WL. When the second input terminal INB may be coupled to the unselected word line unsel_WL using the second local word line switch $LX\_SW_B$, charges may be shared between the second input terminal INB and the unselected word line unsel_WL. Since the voltage level of the unselected word line unsel_WL has been increased due to the second leakage current LK2, the level of the second input terminal INB may increase from the first reference voltage $V_{REF}1$ to the second reference voltage $V_{REF}2$. After the voltage levels of the first input terminal IN and the second input terminal INB are compared with each other, the sense amplifier SA outputs a signal DATA_OUT indicating data of the selected memory cell $MC_A$.

According to the above-described method, the unselected word line unsel_WL may be precharged to the second voltage $V_B$ that has the same level as the first reference voltage $V_{REF}1$, or to a greater voltage level than the first reference voltage $V_{REF}1$. Therefore, the unselected memory cell $MC_B$ may remain turned off. In addition, since the voltage level of the second input terminal INB is increased to the second reference voltage $V_{REF}2$ by using the second leakage current LK2, a sensing margin may be increased. The precharged voltage of the unselected word line unsel_WL is equal to or greater than the first reference voltage $V_{REF}1$, and the second leakage current LK2 further increases the voltage of the unselected word line unsel_WL. When charges are shared by coupling the unselected word line unsel_WL to the second input terminal INB using the second switch $LXSW_B$, the voltage of the second input terminal INB increases from the first reference voltage $V_{REF}1$ to the second reference voltage $V_{REF}2$. As a result, a sensing margin may be increased.

Figure 6A:
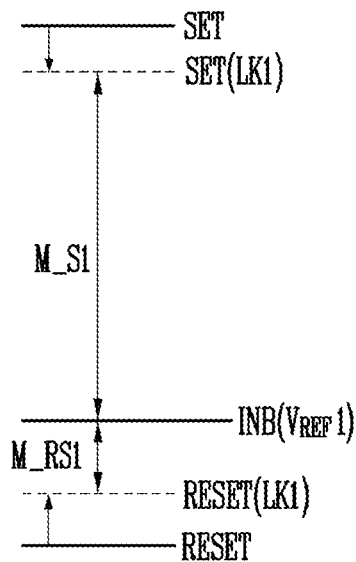
FIGS. 6A and 6B are diagrams illustrating a method of operating an electronic device according to an embodiment of the present disclosure.
Figure 6B:
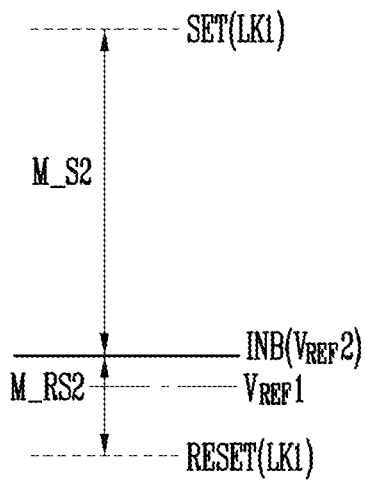

FIGS. 6A and 6B are diagrams illustrating a method of operating an electronic device according to an embodiment of the present disclosure. In FIGS. 6A and 6B, a sensing margin depending on a reference voltage is shown. Hereinafter, repetitive detailed description of components already mentioned above will be omitted for the interest of brevity.

FIGS. 6A and 6B show voltage levels of a first input terminal (e.g., the first input terminal IN FIG. 4A) that are equal to those of a selected word line (e.g., the selected word line sel_WL in FIG. 5B) after charge sharing. For example, a solid line SET represents a voltage level of the selected word line sel_WL when a selected memory cell (e.g., the selected memory cell $MC_A$ in FIG. 5A) is in the SET state, and a dashed line SET(LK1) represents the voltage level of the selected word line sel_WL that is reduced by a first leakage current (e.g., the first leakage current LK1 in FIG. 4A). In addition, a solid line RESET represents a voltage level of the selected word line sel_WL when the selected memory cell $MC_A$ is in the RESET state, and a dashed line RESET(LK1) may represent that the voltage level of the selected word line sel_WL that is increased due to the first leakage current LK1.

Referring to FIG. 6A, the second input terminal INB may have the first reference voltage $V_{REF}1$ and the voltage level of the first input terminal IN may be compared with that that of the first reference voltage $V_{REF}1$. A first sensing margin M_S1 for the SET state and a second sensing margin M_RS1 for the RESET state may be reduced due to the first leakage current LK1. Both the first sensing margin M_S1 and the second sensing margin M_RS1 may be decreased due to the first leakage current LK1. However, as the second sensing margin M_RS1 is decreased at a greater ratio than the first sensing margin M_S1, a sensing margin for the RESET state may be absolutely insufficient in comparison with a sensing margin for the SET state.

Referring to FIG. 6S, the second input terminal INB may have the second reference voltage $V_{REF}2$ and the voltage level of the first input terminal IN may be compared with that that of the second reference voltage $V_{REF}2$. In an embodiment, the second reference voltage $V_{REF}2$ may be separately supplied to the second input terminal INB. In other embodiments, the second reference voltage $V_{REF}2$ may be generated by precharging the second input terminal INB to a given voltage level (e.g., the first reference voltage $V_{REF}1$), increasing the voltage level of the unselected word line using a second leakage current (e.g., the second leakage current LK2 in FIG. 4A), and charge sharing between the second input terminal INS and an unselected word line).

When the second reference voltage $V_{REF}2$ is used, a third sensing margin M_S2 for the SET state may be reduced and a fourth sensing margin M_RS2 for the RESET state may be increased, compared to the first sensing margin M_S1 for the SET state and the second sensing margin M_RS1 for the RESET state, respectively, when the first reference voltage $V_{REF}1$ is used. In other words, instead of reducing the third sensing margin M_S2 for the SET state, the fourth sensing margin M_RS2 for the RESET state may be increased. As a result, the third sensing margin M_S2 for the SET state may remain sufficiently large and the fourth sensing margin M_RS2 for the RESET state may increase to ensure that the resistance state of the selected memory cell $MC_A$ is determined accurately.

Figure 7:
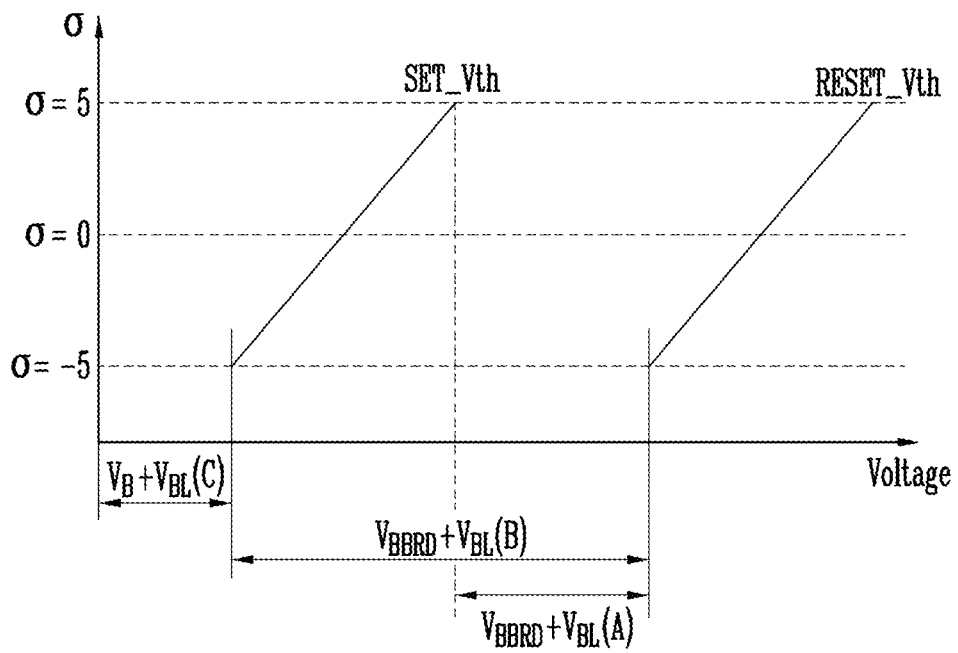
FIG. 7 is a diagram illustrating a method of operating an electronic device according to an embodiment of the present disclosure.

FIG. 7 is a diagram illustrating a method of operating an electronic device according to an embodiment of the present disclosure. The X axis represents a voltage and the Y axis represents a threshold voltage distribution (σ). As shown in FIG. 7, a threshold voltage distribution ranges from σ=−5 to σ=5. For example, the value of the threshold voltage distribution a may be a standard deviation of threshold voltages of a plurality of memory cells each having a specific resistance state. However, the range of a may vary depending on a fail correction range of a memory chip.

Referring to FIG. 7, memory cells in the SET state may have a threshold voltage (or a set threshold voltage) SET_Vth and memory cells in the RESET state may have the threshold voltage (or a reset threshold voltage) RESET_Vth. The voltage levels of the above-described precharge voltages (e.g., the first voltage $V_{BBRD}$ and the second voltage $V_B$ in FIG. 5B) may be determined by considering the threshold voltage distributions of the SET state and the RESET state, respectively.

Referring to FIGS. 5B and 7, during a read operation, since the bit line voltage $V_{BL}$ is applied to the selected bit line sel_BL when the selected word line sel_WL precharged to the first voltage $V_{BBRD}$ is floated, a read voltage $V_{BBRD}$+$V_{BL}$ may be applied to the selected memory cell $MC_A$. Therefore, the precharge voltage $V_{BBRD}$ and the bit line voltage $V_L$ may be controlled so that the memory cell in the SET state may remain turned on and the memory cell in the RESET state may remain turned off. For example, the sum ($V_{BBRD}$+$V_{SL}$) of the precharge voltage $V_{BBRD}$ and the bit line voltage $V_{BL}$ may be in a first interval A that is greater than a maximum value of the threshold voltage SET_Vth of the memory cell having the SET state and smaller than a minimum value of the threshold voltage RESET_Vth of the memory cell having the RESET state. When a monitoring operation or a test operation of a memory chip is performed, the sum ($V_{BBRD}$+$V_{BL}$) of the precharge voltage $V_{BBRD}$ and the bit line voltage $V_{BL}$ may be in a second interval B that is greater than a minimum value of the threshold voltage SET_Vth of the memory cell having the SET state and smaller than the minimum value of the threshold voltage RESET_Vth of the memory cell having the RESET state.

During a read operation, since the bit line voltage $V_{BL}$ is applied to the selected bit line sel_BL when the unselected word line unsel_WL precharged to the second voltage $V_B$ is floated, a read voltage $V_B$+$V_{BL}$ may be applied to the unselected memory cell $MC_B$. Therefore, the precharge voltage $V_B$ and the bit line voltage $V_{BL}$ may be controlled so that both the memory cell in the SET state and the memory cell in the RESET state may remain turned off. For example, the sum ($V_B$+$V_{BL}$) of the precharge voltage $V_B$ and the bit line voltage $V_{BL}$ may be in a third interval C that is smaller than the minimum value of the threshold voltage SET_Vth of the memory cell having the SET state.

The memory circuit or the semiconductor device according to the above-described embodiments may be used in various devices or systems. FIGS. 8 to 12 show some examples of a device or a system embodying the memory circuit or the semiconductor device according to the above-described embodiments.

Figure 8:
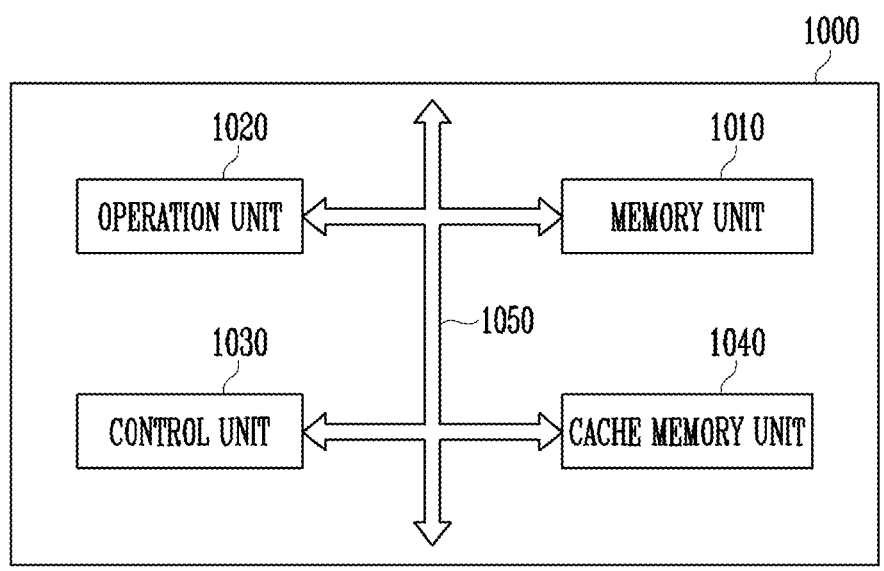
FIG. 8 is a diagram illustrating the configuration of a microprocessor implementing a memory device according to an embodiment of the present disclosure.

FIG. 8 is a diagram illustrating the configuration of a microprocessor 1000 implementing a memory device according to an embodiment of the present disclosure.

Referring to FIG. 8, the microprocessor 1000 may control and adjust a series of processes for receiving data from various external devices, processing the data and sending results to the external devices. The microprocessor 1000 may include a memory unit 1010, an operation unit 1020, and a control unit 1030. The microprocessor 1000 may be various data processing systems such as a central processing unit (CPU), a graphic processing unit (GPU), a digital signal processor (DSP) and an application processor (AP).

The memory unit 1010 of the microprocessor 1000 may be a processor register or a register and may store data. The memory unit 1010 may include various registers including a data register, an address register, and a floating point register. The memory unit 1010 may serve to temporarily store an address at which data on which the operation unit 1020 performs an operation, data corresponding to a result of the operation, and data for performing the operation are stored.

The memory unit 1010 may include at least one of the embodiments of the above-described semiconductor device. For example, the memory unit 1010 may include bit lines, word lines crossing the bit lines, and memory cells coupled between the bit lines and the word lines. During a read operation, a selected word line, among the word lines, may be precharged to a first voltage, an unselected word line, among the word lines, may be precharged to a second voltage greater than the first voltage, the selected word line and the unselected word line may be floated, a bit line voltage may be applied to a selected bit line, among the bit lines, a voltage level of the unselected word line may be increased due to a first leakage current between the unselected bit line and the unselected word line, and the selected word line and the unselected word line may be coupled to the sensing circuit to compare a voltage level of the selected word line with a voltage level of the unselected word line to thereby read a selected memory cell. As a result, read operation characteristics of the memory unit 1010 may be improved. As a result, read operation characteristics of the microprocessor 1000 may be improved.

The operation unit 1020 may perform various four fundamental arithmetic operations or logical operations according to a result of decoding a command. The operation unit 1020 may include at least one arithmetic and logic unit (ALU).

The control unit 1030 may receive signals from the memory unit 1010, the operation unit 1020 and the external devices of the microprocessor 1000, extract or decode a command, control signal input and output of the microprocessor 1000, and execute processing represented by program.

According to the present disclosure, the microprocessor 1000 may further include a cache memory unit 1040 that temporarily stores data input from an external device, in addition to the memory unit 1010, or data to be output to the external device. The cache memory unit 1040 may exchange data with the memory unit 1010, the operation unit 1020 and the control unit 1030 through a bus interface 1050.

Figure 9:
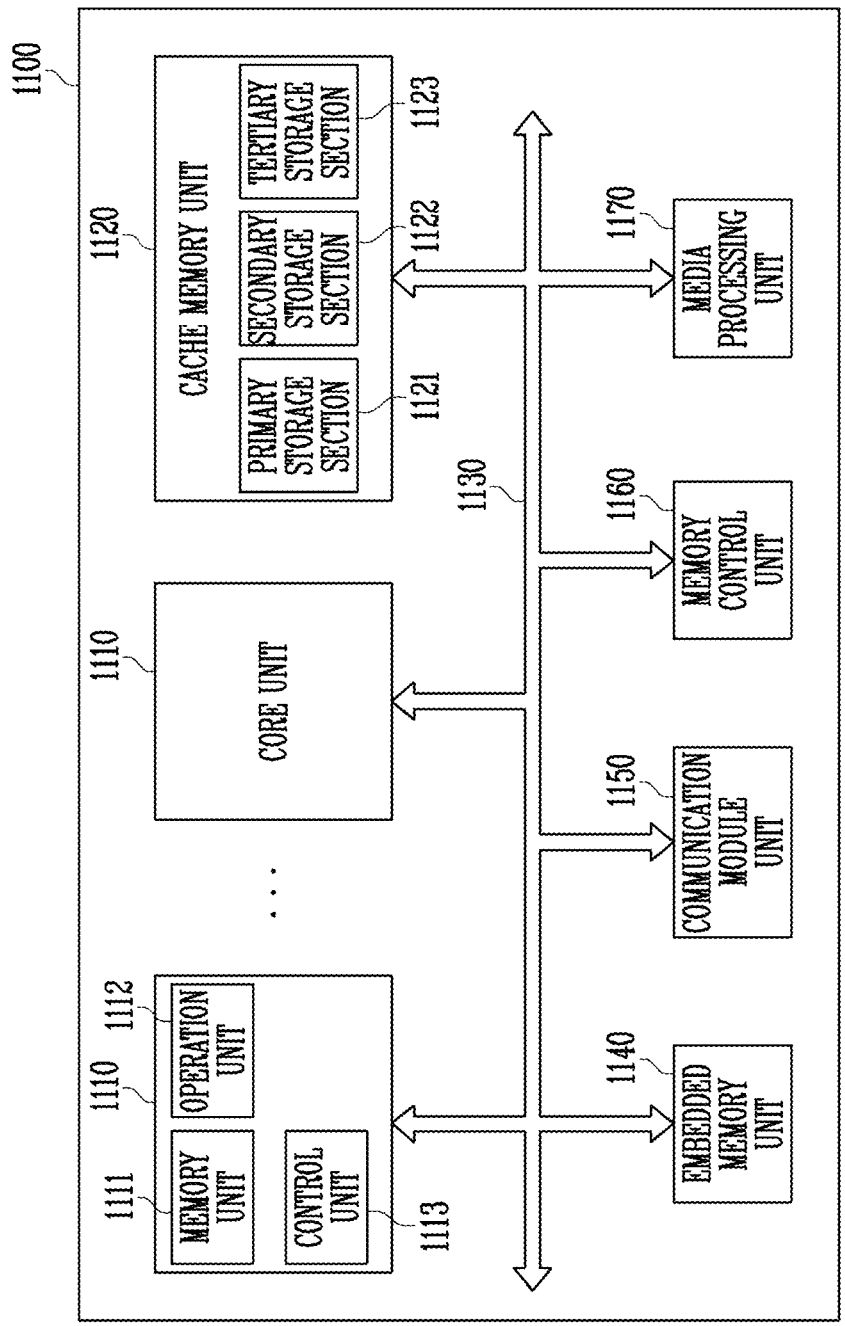
FIG. 9 is a diagram illustrating the configuration of a processor implementing a memory device according to an embodiment of the present disclosure.

FIG. 9 is a diagram illustrating the configuration of a processor 1100 implementing a memory device according to an embodiment of the present disclosure.

Referring to FIG. 9, the processor 1100 may improve performance and perform multiple functions by executing various functions in addition to the functions of a microprocessor for controlling and adjusting a series of processes of receiving and processing data from various external devices and sending results thereof. The processor 1100 may include a core unit 1110 serving as a microprocessor, a cache memory unit 1120 temporarily storing data, and a bus interface 1130 for data transfer between internal and external devices. The processor 1100 may include various types of systems on chip (SoCs) such as a multi-core processor, a graphic processing unit (GPU), and an application processor (AP).

According to an embodiment of the present disclosure, the core unit 1110 may perform arithmetic and logic operations on the data input from the external device and may include a memory unit 1111, an operation unit 1112 and a control unit 1113.

The memory unit 1111 in the microprocessor 1100 may be a processor register or a register and may store data. The memory unit 1010 may include various registers including a data register, an address register, and a floating point register. The memory unit 1111 may serve to temporarily store an address at which data on which an operation is performed, data corresponding to a result of the operation, and data for performing the operation are stored. The operation unit 1112 perform an operation in the processor 1100. More specifically, the operation unit 1112 may perform various four fundamental arithmetic operations or logical operations according to a result of decoding a command. The operation unit 1112 may include at least one arithmetic and logic unit (ALU). The control unit 1113 may receive signals from the memory unit 1111, the operation unit 1112 and the external devices of the processor 1100, extract or decode a command, control signal input and output of the processor 1100, and execute processing represented by program.

The cache memory unit 1120 may temporarily store data so as to compensate for the differences in data processing speed between the core unit 1110 operating at a high speed and the external device operating at a low speed. The cache memory unit 1120 may include a primary storage section 1121, a secondary storage section 1122 and a tertiary storage section 1123. In general, the cache memory unit 1120 may include the primary and secondary storage sections 1121 and 1122. When high capacity is required, the cache memory unit 1120 may further include the tertiary storage section 1123. However, the cache memory unit 1120 may include more storage sections than the three storage sections. In other words, the number of storage sections included in the cache memory unit 1120 may vary depending on the design. The primary, secondary and tertiary storage sections 1121, 1122 and 1123 may have the same or different processing speeds for data storage and determination. When the respective storage sections have different processing speeds, the primary storage section 1121 may have the highest processing speed. At least one of the primary, secondary and tertiary storage sections 1121, 1122 and 1123 may include at least one of the embodiments of the above-described semiconductor device. For example, the cache memory unit 1120 may include bit lines, word lines crossing the bit lines, and memory cells coupled between the bit lines and the word lines. During a read operation, a selected word line, among the word lines, may be precharged to a first voltage, an unselected word line, among the word lines, may be precharged to a second voltage greater than the first voltage, the selected word line and the unselected word line may be floated, a bit line voltage may be applied to a selected bit line, among the bit lines, a voltage level of the unselected word line may be increased due to a first leakage current between the unselected bit line and the unselected word line, and the selected word line and the unselected word line may be coupled to the sensing circuit to compare a voltage level of the selected word line with a voltage level of the unselected word line to thereby read a selected memory cell. Therefore, read operation characteristics of the cache memory unit 1120 may be improved. As a result, read operation characteristics of the processor 1100 may be improved.

As illustrated in FIG. 9, all of the primary, secondary and tertiary storage sections 1121, 1122 and 1123 may be included in the cache memory unit 1120. However, the primary, secondary and tertiary storage sections 1121, 1122 and 1123 of the cache memory unit 1120 may be provided outside the core unit 1110 to compensate for the differences in processing speed between the core unit 1110 and the external device. Alternatively, the primary storage section 1121 of the cache memory unit 1120 may be located in the core unit 1110, and the secondary storage section 1122 and the third storage section 1123 may be provided outside the core unit 1123 to enhance the function of compensating for the differences in processing speed. However, the primary and secondary storage sections 1121 and 1122 may be located in the core unit 1110 and the tertiary storage section 1123 may be located outside the core unit 1110.

The bus interface 1130 may couple the core unit 1110, the cache memory unit 1120 and the external device so as to efficiently transfer data.

According to an embodiment of the present disclosure, the processor 1100 may include a plurality of core units 1110 which may share the cache memory unit 1120. The plurality of core units 1110 and the cache memory unit 1120 may be directly coupled to each other, or may be coupled through the bus interface 1130. Each of the plurality of core units 1110 may have the same configuration as the above-described core unit. When the processor 1100 includes the plurality of core units 1110, the number of primary storage sections 1121 of the cache memory unit 1120 may correspond to the number of core units 1110. Each of the primary storage sections 1121 may be included in each of the core units 1110. In addition, the secondary storage section 1121 and the tertiary storage section 1123 may be provided outside the plurality of core units 1110 and shared through the bus interface 1130. The primary storage section 1121 may have a faster processing speed than the secondary and tertiary storage sections 1122 and 1123. In another embodiment, the number of primary storage sections 1121 and the number of secondary storage sections 1122 may each correspond to the number of core units 1110. Each of the primary sections 1121 and each of the secondary storage sections 1122 may be included in each of the core units 1110. The tertiary storage section 1123 may be provided outside the plurality of core units 1110 through the bus interface 1130.

According to an embodiment of the present disclosure, the processor 1100 may include an embedded memory unit 1140 storing data, a communication module unit 1150 by wire or wirelessly transmitting or receiving the data to or from an external device, a memory control unit 1160 driving an external memory device, and a media processing unit 1170 processing or outputting data, processed by the processor 1100 or input from an external input device, to an external interface device. The processor 1100 may further include various modules and devices including the above devices. The added modules may exchange data with each other and with the core unit 1110 and the cache memory unit 1120 through the bus interface 1130.

The embedded memory unit 1140 may include a non-volatile memory as well as a volatile memory. A volatile memory may include dynamic random access memory (DRAM), a Mobile DRAM, Static Random Access Memory (SRAM), and memory with similar functions. A non-volatile memory may include Read Only Memory (ROM), NOR Flash Memory, NAND Flash Memory, Phase Change Random Access Memory (PRAM), Resistive Random Access Memory (RRAM), Spin Transfer Torque Random Access Memory (STTRAM), Magnetic Random Access Memory (MRAM), and a memory with similar functions.

The communication module unit 1150 may include either or both a module connected to a wired network and a module connected to a wireless network. A wired network module may include a Local Area Network (LAN), Universal Serial Bus USB), Ethernet, Power Line Communication (PLC) in the same manner as various devices transmitting and receiving data through a transmission line. In the same manner as various devices transmitting and receiving data without a transmission line, a wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like.

The memory control unit 1160 may include various memory controllers for processing and managing data transferred between the processor 1100 and an external storage device operating according to a different communication standard from the processor 1100. For example, the memory control unit 1160 may include a controller controlling Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multi media card (MMC), an embedded MMC (eMMC), a compact flash (CF) card, or the like.

The media processing unit 1170 may process data processed by the processor 1100, or data in video, audio, or another form which is input from an external input device, and may output the data to an external interface device. The media processing unit 1170 may include a Graphics Processing Unit (GPU), a Digital Signal Processor (DSP), a High Definition (HD) Audio, a high definition multimedia interface (HDMI) controller, or the like.

Figure 10:
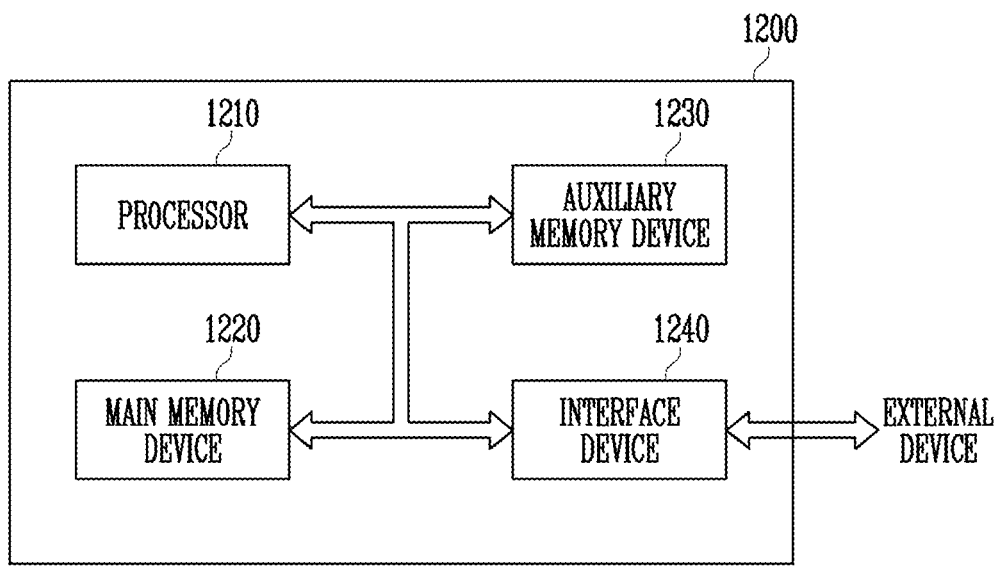
FIG. 10 is a diagram illustrating the configuration of a system implementing a memory device according to an embodiment of the present disclosure.

FIG. 10 is a diagram illustrating the configuration of a system 1200 implementing a memory device according to an embodiment of the present disclosure.

Referring to FIG. 10, the system 1200 may refer to a device configured to process data. To perform a series of manipulations for data, the system 1200 may perform input, processing, output, communication, storage, and the like to perform a series of operations on data. The system 1200 may include a processor 1210, a main memory device 1220, an auxiliary memory device 1230, and an interface 1240. According to an embodiment of the present disclosure, the system 1200 may be a variety of electronic systems that operate by processes, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 may control the decoding of input commands and the processing of the data stored in the system 1200, such as operation and comparison. The processor 1210 may include a microprocessor unit (MPU), a central processing unit (CPU), a single/multi-core processor, a graphic processing unit (GPU), an application processor (AP), digital signal processor (DSP), and so on.

The main memory device 1220 may refer to a storage where program codes or material is moved from the auxiliary memory device 1230, and stored and executed when program is executed. The stored data may be retained even in the absence of power supply. The main memory unit 1220 may include at least one of the embodiments of the above-described semiconductor device. For example, the main memory device 1220 may include bit lines, word lines crossing the bit lines, and memory cells coupled between the bit lines and the word lines. During a read operation, a selected word line, among the word lines, may be precharged, the selected word line may be floated, a selected bit line, among the bit lines, may be driven so that a voltage level of the selected bit line may be increased. When a selected memory cell is turned on, the driving of the bit line may be stopped. As a result, read operation characteristics of the main memory device 1220 may be improved. As a result, read operation characteristics of the system 1200 may be improved.

In addition, the main memory device 1220 may further include a volatile static random access memory (SRAM) or a volatile dynamic random access memory (DRAM) which loses all data when power supply is blocked. However, in another example, the main memory device 1220 may not include the semiconductor device according to the above-described embodiment and may include a volatile static random access memory (SRAM) or a volatile dynamic random access memory (DRAM) which loses all data when power supply is blocked.

The auxiliary memory device 1230 may refer to a memory device designed to store program codes or data. Although the auxiliary memory device 1230 is slower than the main memory device 1220, the auxiliary memory device 1230 may store more data than the main memory device 1220. The main memory device 1230 may include at least one of the embodiments of the above-described semiconductor device. For example, the auxiliary memory device 1230 may include bit lines, word lines crossing the bit lines, and memory cells coupled between the bit lines and the word lines. During a read operation, a selected word line, among the word lines, may be precharged to a first voltage, an unselected word line, among the word lines, may be precharged to a second voltage greater than the first voltage, the selected word line and the unselected word line may be floated, a bit line voltage may be applied to a selected bit line, among the bit lines, a voltage level of the unselected word line may be increased due to a first leakage current between the unselected bit line and the unselected word line, and the selected word line and the unselected word line may be coupled to the sensing circuit to compare a voltage level of the selected word line with a voltage level of the unselected word line to thereby read a selected memory cell. Therefore, read operation characteristics of the auxiliary memory device 1230 may be improved. As a result, read operation characteristics of the system 1200 may be improved.

Figure 11:
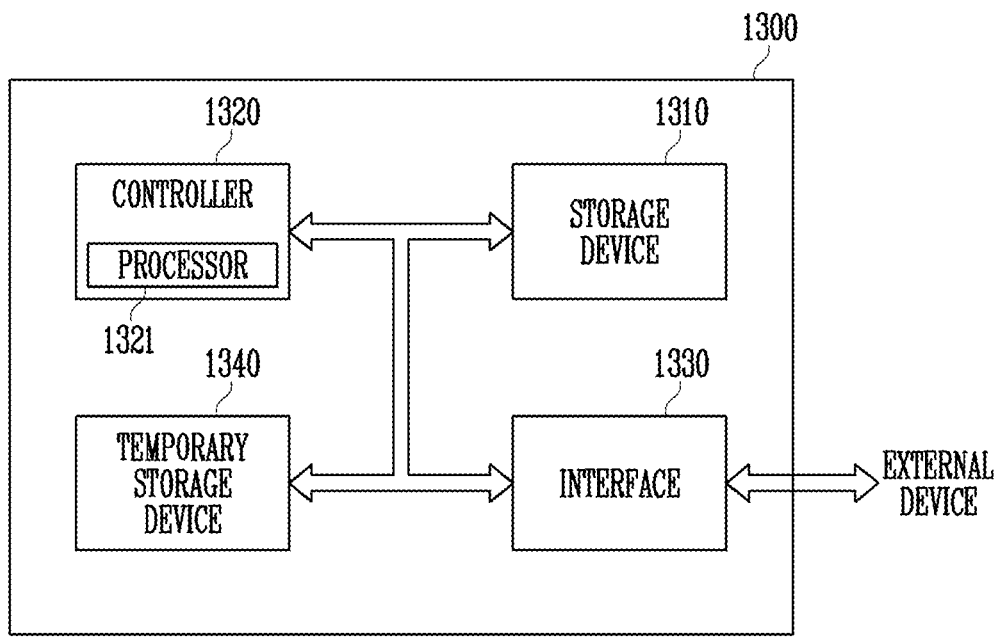
FIG. 11 is a diagram illustrating the configuration of a data storage system implementing a memory device according to an embodiment of the present disclosure.

In addition, the auxiliary memory device 1230 may further include a data storage system 1300 as shown in FIG. 11, such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and so on. However, in contrast thereto, the auxiliary memory device 1230 may not include the semiconductor device according to the above-described embodiment and may further include the data storage system 1300 as shown in FIG. 11, such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a microphone, a display, various human interface devices (HIDs), a communication device, and so on. The communication device may include either or both a module connected to a wired network and a module connected to a wireless network. In the same manner as various devices which transmit and receive data through transmission lines, the wired network module may include a Local Area Network (LAN), a Universal Serial Bus (USB), an Ethernet, Power Line Communication (PLC). In the same manner as various devices which transmit and receive data without a transmission line, the wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like.

FIG. 11 is a diagram illustrating the configuration of the data storage system 1300 implementing a memory device according to an embodiment of the present disclosure.

Referring to FIG. 11, the data storage system 1300 may include a storage device 1310 having a nonvolatile characteristic as a component for storing data, a controller 1320 controlling the storage device 1310, an interface 1330 for connection with an external device, and a temporary storage device 1340 for temporarily storing data. The data storage system 1300 may be a disk type such as a hard disk drive (HDD), a compact disc read only memory (CDROM), a digital versatile disc (DVD), and a solid state disk (SSD), and a card type such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card.

The storage device 1310 may include a non-volatile memory which stores data semi-permanently. The non-volatile memory may include a read only memory (ROM), a NOR flash memory, a NAND flash memory, a phase change random access memory (PRAM), a resistive random access memory (RRAM), and a magnetic random access memory (MRAM).

The memory controller 1320 may control data exchange between the storage device 1310 and the interface 1330. The controller 1320 may include a processor 1321 for performing an operation for processing commands input through the interface 1330 from an external device of the data storage system 1300.

The interface 1330 may be provided to exchange commands and data between external devices. In the case where the data storage system 1300 is a card type, the interface 1330 may be compatible with interfaces which are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces which are used in devices similar to the above-mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal, serial bus), or may be compatible with interfaces which are similar to the above-mentioned interfaces. The interface 1330 may be compatible with one or more interfaces having different types.

The temporary storage device 1340 may temporarily store data for efficiently transferring data between the interface 1330 and the storage device 1310 according to diversifications and high performance of an interface with an external device, a controller and a system. The main memory device 1340 may include at least one of the embodiments of the above-described semiconductor device. For example, the auxiliary memory device 1340 may include bit lines, word lines crossing the bit lines, and memory cells coupled between the bit lines and the word lines. During a read operation, a selected word line, among the word lines, may be precharged to a first voltage, an unselected word line, among the word lines, may be precharged to a second voltage greater than the first voltage, the selected word line and the unselected word line may be floated, a bit line voltage may be applied to a selected bit line, among the bit lines, a voltage level of the unselected word line may be increased due to a first leakage current between the unselected bit line and the unselected word line, and the selected word line and the unselected word line may be coupled to the sensing circuit to compare a voltage level of the selected word line with a voltage level of the unselected word line to thereby read a selected memory cell. Therefore, read operation characteristics of the temporary memory device 1340 may be improved. As a result, read operation characteristics of the data storage system 1300 may be improved.

Figure 12:
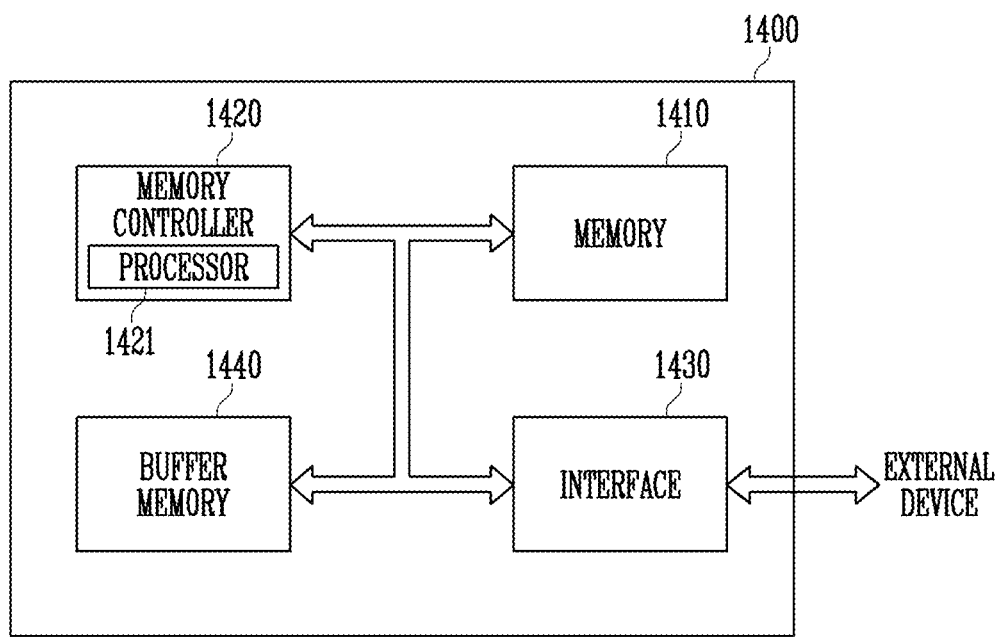
FIG. 12 is a diagram illustrating the configuration of a memory system implementing a memory device according to an embodiment of the present disclosure.

FIG. 12 is a diagram illustrating the configuration of a memory system 1400 implementing a memory device according to an embodiment of the present disclosure.

Referring to FIG. 12, the memory system 1400 may include a memory 1410 having a nonvolatile characteristic as a component for storing data, a memory controller 1420 controlling the memory 1410, and an interface 1430 for connection with an external device. The memory system 1400 may be a card type such as a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card.

The memory 1410 storing data may include at least one of the embodiments of the above-described semiconductor device. For example, the memory 1410 may include bit lines, word lines crossing the bit lines, and memory cells coupled between the bit lines and the word lines. During a read operation, a selected word line, among the word lines, may be precharged to a first voltage, an unselected word line, among the word lines, may be precharged to a second voltage greater than the first voltage, the selected word line and the unselected word line may be floated, a bit line voltage may be applied to a selected bit line, among the bit lines, a voltage level of the unselected word line may be increased due to a first leakage current between the unselected bit line and the unselected word line, and the selected word line and the unselected word line may be coupled to the sensing circuit to compare a voltage level of the selected word line with a voltage level of the unselected word line to thereby read a selected memory cell. Thus, read operation characteristics of the memory 1410 may be improved. As a result, read operation characteristics of the memory system 1400 may be improved.

In addition, the memory according to this embodiment may include a read only memory (ROM), a NOR flash memory, a NAND flash memory, a phase change random access memory (PRAM), a resistive random access memory (RRAM), and a magnetic random access memory (MRAM).

The memory controller 1420 may control data exchange between the memory 1410 and the interface 1430. The controller 1420 may include a processor 1421 for performing an operation for processing commands input through the interface 1430 from an external device of the memory system 1400.

The interface 1430 may be provided to exchange commands and data between the memory system 1400 and the external device. The interface 1430 may be compatible with interfaces which are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces which are used in devices similar to the above-mentioned devices. The interface 1430 may be compatible with one or more interfaces having different types.

According to this embodiment, the memory system 1400 may further include a buffer memory 1440 for efficient transfer of data input and output between the interface 1430 and the memory 1410 according to diversification and high performance of an interface with an external device, a memory controller and a memory system. The memory 1440 temporarily storing data may include at least one of the embodiments of the above-described semiconductor device. For example, the buffer memory 1440 may include bit lines, word lines crossing the bit lines, and memory cells coupled between the bit lines and the word lines. During a read operation, a selected word line, among the word lines, may be precharged to a first voltage, an unselected word line, among the word lines, may be precharged to a second voltage greater than the first voltage, the selected word line and the unselected word line may be floated, a bit line voltage may be applied to a selected bit line, among the bit lines, a voltage level of the unselected word line may be increased due to a first leakage current between the unselected bit line and the unselected word line, and the selected word line and the unselected word line may be coupled to the sensing circuit to compare a voltage level of the selected word line with a voltage level of the unselected word line to thereby read a selected memory cell. Thus, read operation characteristics of the buffer memory 1440 may be improved. As a result, read operation characteristics of the memory system 1400 may be improved.

In addition, according to this embodiment, the buffer memory 1440 may further include a volatile static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a nonvolatile characteristic. However, contrary thereto, the buffer memory 1440 may not include the semiconductor device according to the above-described embodiment and may further include a static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a nonvolatile characteristic.

According to various embodiments of the present disclosure, read disturbance may be prevented and a read operation may be performed more stably.

Example embodiments have been disclosed herein, and although specific terms are employed, they are used and are to be interpreted in a generic and descriptive sense only and not for purpose of limitation. In some instances, as would be apparent to one of ordinary skill in the art as of the effective filing date of the present patent document, features, characteristics, and/or elements described in connection with a particular embodiment may be used singly or in combination with features, characteristics, and/or elements described in connection with other embodiments unless otherwise specifically indicated. Accordingly, it will be understood by those skilled in the art that various changes in forms and details may be made without departing from the spirit and scope of the present disclosure as set forth in the following claims.

What is claimed is:

1. A method of operating an electronic device including a plurality of bit lines and a plurality of word lines, the method comprising:
    precharging a selected word line from the plurality of word lines to a first voltage;
    precharging an unselected word line from the plurality of word lines to a second voltage;

floating the selected word line and the unselected word line;

applying a bit line voltage to a selected bit line from the plurality of bit lines;

adjusting a voltage level of the unselected word line using a first leakage current that flows between an unselected bit line and the unselected word line;

coupling the selected word line and the unselected word line to a sensing circuit; and comparing a voltage level of the selected word line with the voltage level of the unselected word line.

2. The method of claim 1, wherein each of the first and second voltages has a negative level, the second voltage being greater than the first voltage.

3. The method of claim 1, wherein the comparing of the voltage levels comprises sensing the voltage level of the selected word line based on the voltage level of the unselected word line to read data of a selected memory cell, the selected memory cell being coupled between the selected bit line and the selected word line.

4. The method of claim 1, wherein the voltage level of the selected word line is changed by a second leakage current that flows between the unselected bit line and the selected word line.

5. The method of claim 1, wherein the voltage level of the selected word line is sensed based on the voltage level of the unselected word line increased due to the first leakage current.

6. The method of claim 1, wherein the comparing of the voltage levels comprises:

precharging a first input terminal of the sensing circuit to a first reference voltage;

precharging a second input terminal of the sensing circuit to the first reference voltage;

adjusting a voltage level of the first input terminal by coupling the selected word line to the first input terminal;

adjusting a voltage level of the second input terminal to a second reference voltage by coupling the second input terminal to the unselected word line, the second reference voltage being greater than the first reference voltage; and comparing the voltage level of the first input terminal with the second reference voltage.

7. The method of claim 6, wherein the second voltage has a level equal to or greater than that of the first reference voltage.

8. The method of claim 1, wherein a voltage applied to a selected memory cell is smaller than a reset threshold voltage, the selected memory cell being coupled between the selected bit line and the selected word line.

9. The method of claim 1, wherein a voltage applied to an unselected memory cell is smaller than a set threshold voltage, the unselected memory cell being coupled between the unselected bit line and the unselected word line.

10. The method of claim 1, wherein the comparing of the voltage levels comprises coupling the unselected word line to the sensing circuit when the selected word line is coupled to the sensing circuit.

11. The method of claim 1, wherein the comparing of the voltage levels comprises coupling the selected word line to the sensing circuit after the unselected word line is coupled to the sensing circuit.

12. The method of claim 1, wherein when the bit line voltage is applied, a selected memory cell having a set state is turned on, and a selected memory cell having a reset state and unselected memory cells remain turned off.

13. An electronic device, comprising:

a semiconductor memory including a plurality of bit lines, a plurality of word lines crossing the plurality of bit lines, and a plurality of memory cells coupled between the plurality of bit lines and the plurality of word lines, respectively; and a sensing circuit configured to sense a state of a selected memory cell from the plurality of memory cells, wherein, during a read operation of the selected memory cell, the electronic device is configured to precharge a selected word line from the plurality of word lines to a first voltage, to precharge an unselected word line from the plurality of word lines to a second voltage, to float the selected word line and the unselected word line, to apply a bit line voltage a selected bit line from the plurality of bit lines, to adjust a voltage level of the unselected word line using a first leakage current that flows between an unselected bit line and the unselected word line, to couple the selected word line and the unselected word line to the sensing circuit, and to compare a voltage level of the selected word line with the voltage level of the unselected word line.

14. The electronic device of claim 13, wherein each of the first and second voltages has a negative level, the second voltage being greater than the first voltage.

15. The electronic device of claim 13, wherein the sensing circuit senses the voltage level of the selected word line based on the voltage level of the unselected word line, the selected memory cell being coupled between the selected bit line and the selected word line.

16. The electronic device of claim 13, wherein the voltage level of the selected word line is changed by a second leakage current that flows between the unselected bit line and the selected word line.

17. The electronic device of claim 13, wherein the voltage level of the selected word line is sensed based on the voltage level of the unselected word line increased due to the first leakage current.

18. The electronic device of claim 17, further comprising:

a first word line switch configured to couple the selected word line to the first input terminal of the sensing circuit in response to a first word line signal; and a second word line switch configured to couple the unselected word line to the second input terminal of the sensing circuit in response to a second word line signal, wherein the first word line signal is activated after the second word line signal is activated.

19. The electronic device of claim 13, wherein when the voltage level of the selected word line and the voltage level of the unselected word line are compared, the electronic device is configured to precharge a first input terminal of the sensing circuit to a first reference voltage, to precharge a second input terminal of the sensing circuit to the first reference voltage, to adjust a voltage level of the first input terminal by coupling the selected word line to the first input terminal, to adjust a voltage level of the second input terminal to a second reference voltage by coupling the second input terminal to the unselected word line, and to compare the voltage level of the first input terminal with the second reference voltage, the second reference voltage being greater than the first reference voltage.

20. The electronic device of claim 19, wherein the second voltage has a level equal to or greater than that of the first reference voltage.

* * * * *